(12) United States Patent
Kurataka et al.

(10) Patent No.: US 7,074,341 B1
(45) Date of Patent: Jul. 11, 2006

(54) METHOD FOR PROTECTING SURFACE OF STAMPER/IMPRINTER DURING MANUFACTURE THEREOF

(75) Inventors: Nobuo Kurataka, Campbell, CA (US); Christopher J. Formato, Brentwood, CA (US); Hong Ying Wang, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 369 days.

(21) Appl. No.: 10/603,088

(22) Filed: Jun. 25, 2003

Related U.S. Application Data

(60) Provisional application No. 60/393,573, filed on Jul. 1, 2002.

(51) Int. Cl.
*B44C 1/22* (2006.01)

(52) U.S. Cl. .................. 216/22; 216/41; 29/603.1; 29/603.18; 430/313; 264/293

(58) Field of Classification Search ............... 216/22, 216/41; 29/603.01–603.18; 430/313; 264/293
See application file for complete search history.

(56) References Cited

U.S. PATENT DOCUMENTS

| | | | | |
|---|---|---|---|---|
| 5,991,104 A | * | 11/1999 | Bonyhard | 360/15 |
| 6,638,692 B1 | * | 10/2003 | Banal et al. | 430/320 |
| 6,869,557 B1 | * | 3/2005 | Wago et al. | 264/293 |
| 2003/0133114 A1 | * | 7/2003 | Hickman | 356/399 |

* cited by examiner

*Primary Examiner*—Shamim Ahmed
(74) *Attorney, Agent, or Firm*—McDermott Will & Emery LLP

(57) ABSTRACT

A method of manufacturing a stamper/imprinter for use in patterning of a recording medium comprising the sequential steps of providing a substrate/workpiece comprising a topographical pattern formed in a portion of a surface of the substrate/workpiece. The pattern defines a periphery. An alignment mark is formed in another portion of the surface of surrounding the periphery. An opaque protective film is formed overlying the entirety of the surface. A peripheral portion of the protective film is removed to expose the alignment mark. Selected portions of the substrate/workpiece are removed while the alignment mark is utilized for accurate alignment during the removal process. Remaining portions of the protective film are removed prior to use.

21 Claims, 6 Drawing Sheets

Patterned Medium

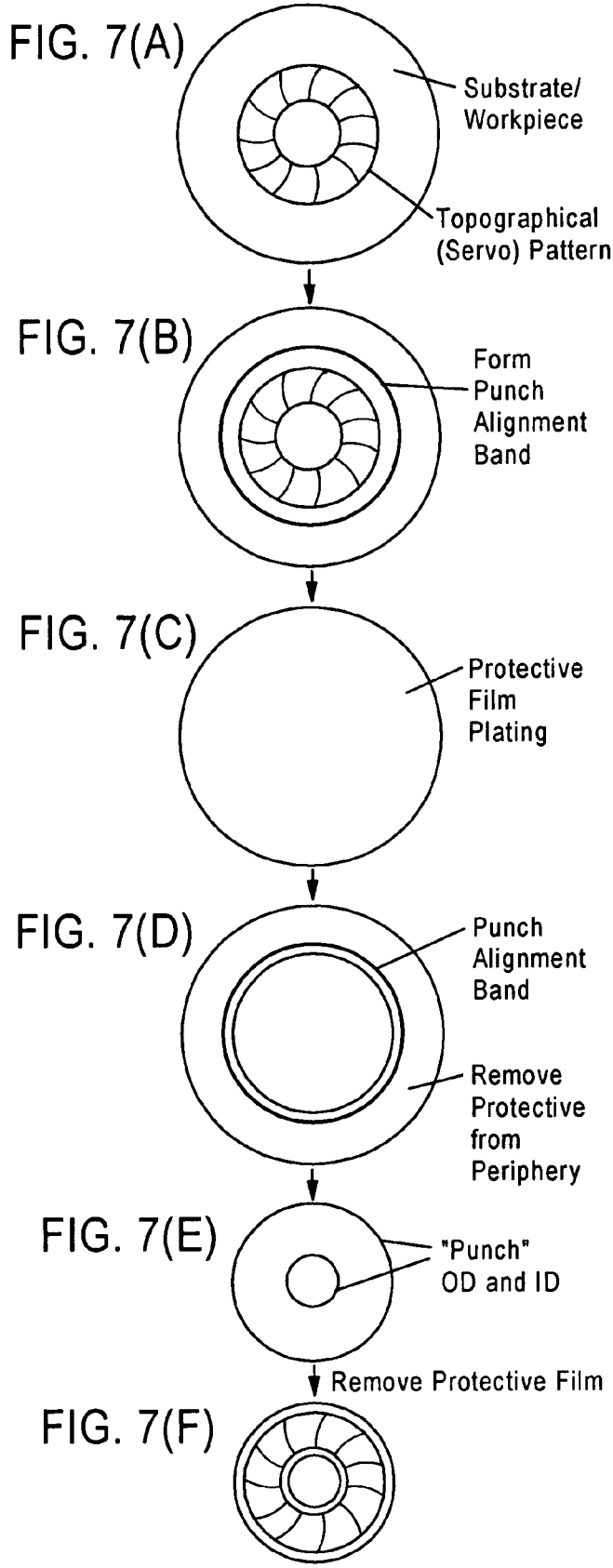
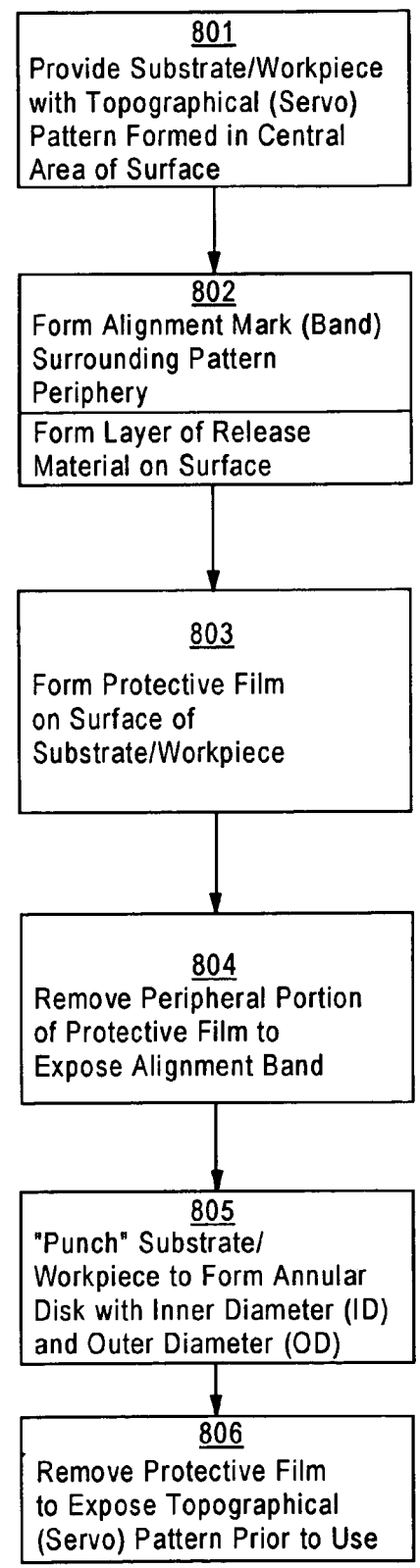

METHOD FOR PROTECTING SURFACE OF STAMPER/IMPRINTER DURING MANUFACTURE THEREOF

CROSS-REFERENCE TO PROVISIONAL APPLICATION

This application claims priority from U.S. provisional patent application Ser. No. 60/393,573 filed Jul. 1, 2002, the entire disclosure of which is incorporated herein by reference.

FIELD OF THE INVENTION

The present invention relates to a method for reliably manufacturing stampers/imprinters utilized for rapid, cost-effective patterning of a layer or body of a recording medium, without incurring damage to the imprinting surface during processing for obtaining a desired geometrical shape. The invention has particular utility in the formation of patterns, e.g., servo patterns, in the surfaces of recording layers of data/information storage and retrieval media, e.g., hard disks.

BACKGROUND OF THE INVENTION

Recording media of various types, e.g., magnetic, optical, magneto-optical ("MO"), read-only memory ("ROM"), readable compact disks ("CD-R"), and readable-writable compact disks ("CD-RW") are widely used in various applications, e.g., in hard disk form, particularly in the computer industry for storage and retrieval of large amounts of data/information. Typically, such media types require pattern formation in the major surface(s) thereof for facilitating operation thereof. For example, magnetic and magneto-optical (MO) recording disks require formation of servo patterns for positioning the read-write transducer over a particular band or region of the media; ROM disks require formation of memory patterns therein; and CD-R and CD-RW disks require formation of wobble groove patterns therein.

Magnetic and magneto-optical (MO) recording media are conventionally fabricated in thin film form; the former are generally classified as "longitudinal" or "perpendicular", depending upon the orientation (i.e., parallel or perpendicular) of the magnetic domains of the grains of the magnetic material constituting the active magnetic recording layer, relative to the surface of the layer.

In operation of magnetic media, the magnetic layer is locally magnetized by a write transducer or write head to record and store data/information. The write transducer creates a highly concentrated magnetic field which alternates direction based on the bits of information being stored. When the local magnetic field applied by the write transducer is greater than the coercivity of the recording medium layer, then the grains of the polycrystalline magnetic layer at that location are magnetized. The grains retain their magnetization after the magnetic field applied by the write transducer is removed. The direction of the magnetization matches the direction of the applied magnetic field. The pattern of magnetization of the recording medium can subsequently produce an electrical response in a read transducer, allowing the stored medium to be read.

A typical contact start/stop (CSS) method employed during use of disk-shaped recording media, such as the above-described thin-film magnetic recording media, involves a floating transducer head gliding at a predetermined distance from the surface of the disk due to dynamic pressure effects caused by air flow generated between mutually sliding surfaces of the transducer head and the disk. During reading and recording (writing) operations, the transducer head is maintained at a controlled distance from the recording surface, supported on a bearing of air as the disk rotates, such that the transducer head is freely movable in both the circumferential and radial directions, thereby allowing data to be recorded and retrieved from the disk at a desired position in a data zone.

Adverting to FIG. 1, shown therein, in simplified, schematic plan view, is a magnetic recording disk 30 (of either longitudinal or perpendicular type) having a data zone 34 including a plurality of servo tracks, and a contact start/stop (CSS) zone 32. A servo pattern 40 is formed within the data zone 34, and includes a number of data track zones 38 separated by servo tracking zones 36. The data storage function of disk 30 is confined to the data track zones 38, while servo tracking zones 36 provide information to the disk drive which allows a read/write head to maintain alignment on the individual, tightly-spaced data tracks.

Although only a relatively few of the servo tracking zones are shown in FIG. 1 for illustrative simplicity, it should be recognized that the track patterns of the media contemplated herein may include several hundreds of servo zones to improve head tracking during each rotation of the disk. In addition, the servo tracking zones need not be straight radial zones as shown in the figure, but may instead comprise arcs, intermittent zones, partial spirals, or irregularly-shaped zones separating individual data tracks.

In conventional hard disk drives, data is stored in terms of bits along the data tracks. In operation, the disk is rotated at a relatively high speed, and the magnetic head assembly is mounted on the end of a support or actuator arm, which radially positions the head on the disk surface. If the actuator arm is held stationary, the magnetic head assembly will pass over a circular path on the disk, i.e., over a data track, and information can be read from or written to that track. Each concentric track has a unique radius, and reading and writing information from or to a specific track requires the magnetic head to be located above that track. By moving the actuator arm, the magnetic head assembly is moved radially on the disk surface between tracks. Many actuator arms are rotatable, wherein the magnetic head assembly is moved between tracks by activating a servomotor which pivots the actuator arm about an axis of rotation. Alternatively, a linear actuator may be used to move a magnetic head assembly radially inwardly or outwardly along a straight line.

As has been stated above, to record information on the disk, the transducer creates and applies a highly concentrated magnetic field in close proximity to the magnetic recording medium. During writing, the strength of the concentrated magnetic field directly under the write transducer is greater than the coercivity of the recording medium, and grains of the recording medium at that location are magnetized in a direction which matches the direction of the applied magnetic field. The grains of the recording medium retain their magnetization after the magnetic field is removed. As the disk rotates, the direction of the writing magnetic field is alternated, based on bits of the information being stored, thereby recording a magnetic pattern on the track directly under the write transducer.

On each track, eight "bits" typically form one "byte" and bytes of data are grouped as sectors. Reading or writing a sector requires knowledge of the physical location of the data in the data zone so that the servo-controller of the disk drive can accurately position the read/write head in the correct location at the correct time. Most disk drives use disks with embedded "servo patterns" of magnetically readable information. The servo patterns are read by the magnetic head assembly to inform the disk drive of track location. In conventional disk drives, tracks typically include both data sectors and servo patterns and each servo pattern typically includes radial indexing information, as well as a "servo burst". A servo burst is a centering pattern to precisely position the head over the center of the track. Because of the locational precision needed, writing of servo patterns requires expensive servo-pattern writing equipment and is a time consuming process.

Commonly assigned, co-pending U.S. patent application Ser. No. 10/082,178, filed Feb. 26, 2002, the entire disclosure of which is incorporated herein by reference, discloses an improvement over the invention disclosed in commonly assigned U.S. Pat. No. 5,991,104, and is based upon the finding that very sharply defined magnetic transition patterns can be reliably, rapidly, and cost-effectively formed in a magnetic medium containing a longitudinal or perpendicular type magnetic recording layer without requiring expensive, complicated fabrication of a master disk.

Specifically, the invention disclosed in U.S. patent application Ser. No. 10/082,178 is based upon recognition that a stamper/imprinter (analogous to the aforementioned "master") comprised of a magnetic material having a high saturation magnetization, $B_{sat}$, i.e., $B_{sat} \geq$ about 0.5 Tesla, and a high permeability, $\mu$, i.e., $\mu \geq$ about 5, e.g., selected from Ni, NiFe, CoNiFe, CoSiFe, CoFe, and CoFeV, can be effectively utilized as a contact "stamper/imprinter" for contact "imprinting" of a magnetic transition pattern, e.g., a servo pattern, in the surface of a magnetic recording layer of a magnetic medium ("workpiece"), whether of longitudinal or perpendicular type. A key feature of this invention is the use of a stamper/imprinter having an imprinting surface including a topographical pattern, i.e., comprised of projections and depressions, corresponding to a desired magnetic transition pattern, e.g., a servo pattern, to be formed in the magnetic recording layer. An advantage afforded by the invention is the ability to fabricate the topographically patterned imprinting surface of the stamper/imprinter, as well as the substrate or body therefor, of a single material, as by use of well-known and economical electro-forming techniques (described below in more detail).

According to this invention, the magnetic domains of the magnetic recording layer of the workpiece are first unidirectionally aligned (i.e., "erased" or "initialized"), as by application of a first external, unidirectional magnetic field $H_{initial}$ of first direction and high strength greater than the saturation field of the magnetic recording layer, typically $\geq 2,000$ and up to about 20,000 Oe. The imprinting surface of the stamper/imprinter is then brought into intimate (i.e., touching) contact with the surface of the magnetic recording layer. With the assistance of a second externally applied magnetic field of second, opposite direction and lower but appropriate strength $H_{re-align}$, determined by $B_{sat}/\mu$ of the stamper material (typically $\geq 100$ Oe, e.g., from about 2,000 to about 4,500 Oe), the alignment of the magnetic domains at the areas of contact between the projections of the imprinting surface of the stamper/imprinter (in the case of perpendicular recording media, as schematically illustrated in FIG. 2) or at the areas facing the depressions of the imprinting surface of the stamper/imprinter (in the case of longitudinal recording media, as schematically illustrated in FIG. 3) and the magnetic recording layer of the workpiece is selectively reversed, while the alignment of the magnetic domains at the non-contacting areas (defined by the depressions in the imprinting surface of the stamper/imprinter) or at the contacting areas, respectively, is unaffected, whereby a sharply defined magnetic transition pattern is created within the magnetic recording layer of the workpiece to be patterned which essentially mimics the topographical pattern of projections and depressions of the imprinting surface. According to the invention, high $B_{sat}$ and high $\mu$ materials are preferred for use as the stamper/imprinter in order to: (1) avoid early magnetic saturation of the stamper/imprinter at the contact points between the projections of the imprinting surface and the magnetic recording layer, and (2) provide an easy path for the magnetic flux lines which enter and/or exit at the side edges of the projections.

Another process which has been recently studied and developed as a low cost alternative technique for fine dimension pattern/feature formation in a substrate surface is thermal imprint lithography. A typical thermal imprint lithographic process for forming nano-dimensioned patterns/features in a substrate surface is illustrated with reference to the schematic, cross-sectional views of FIGS. 4 (A)–4 (D).

Referring to FIG. 4 (A), shown therein is a stamper/imprinter 10 including a main (or support) body 12 having upper and lower opposed surfaces, with an imprinting layer 14 formed on the lower opposed surface. As illustrated, stamper/imprinter 14 includes a plurality of features 16 having a desired shape or surface contour. A workpiece 18 carrying a thin film layer 20 on an upper surface thereof is positioned below, and in facing relation to the molding layer 14. Thin film layer 20, e.g., of polymethylmethacrylate (PMMA), may be formed on the substrate/workpiece surface by any appropriate technique, e.g., spin coating.

Adverting to FIG. 4 (B), shown therein is a compressive molding step, wherein stamper/imprinter 10 is pressed into the thin film layer 20 in the direction shown by arrow 22, so as to form depressed, i.e., compressed, regions 24. In the illustrated embodiment, features 16 of the imprinting layer 14 are not pressed all of the way into the thin film layer 20 and thus do not contact the surface of the underlying substrate 18. However, the top surface portions 24a of thin film 20 may contact depressed surface portions 16a of imprinting layer 14. As a consequence, the top surface portions 24a substantially conform to the shape of the depressed surface portions 16a, for example, flat. When contact between the depressed surface portions 16a of imprinting layer 14 and thin film layer 20 occurs, further movement of the imprinting layer 14 into the thin film layer 20 stops, due to the sudden increase in contact area, leading to a decrease in compressive pressure when the compressive force is constant.

FIG. 4 (C) shows the cross-sectional surface contour of the thin film layer 20 following removal of stamper/imprinter 10. The imprinted thin film layer 20 includes a plurality of recesses formed at compressed regions 24 which generally conform to the shape or surface contour of features 16 of the molding layer 14. Referring to FIG. 4 (D), in a next step, the surface-imprinted workpiece is subjected to processing to remove the compressed portions 24 of thin film 20 to selectively expose portions 28 of the underlying substrate 18 separated by raised features 26. Selective removal of the compressed portions 24 may be accomplished by any appropriate process, e.g., reactive ion etching (RIE) or wet chemical etching.

The above-described imprint lithographic processing is capable of providing sub-micron-dimensioned features, as by utilizing a stamper/imprinter 10 provided with patterned features 16 comprising pillars, holes, trenches, etc., by means of e-beam lithography, RIE, or other appropriate patterning method. Typical depths of features 16 range from about 5 to about 200 nm, depending upon the desired lateral dimension. The material of the imprinting layer 14 is typically selected to be hard relative to the thin film layer 20, the latter comprising a thermoplastic material which is softened when heated. Thus, suitable materials for use as the imprinting layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

Referring now to FIG. 5, schematically illustrated therein, in simplified cross-sectional view, is a sequence of processing steps for performing nano-imprint lithography of a metal-based workpiece, e.g., a disk-shaped substrate for a hard disk recording medium, utilizing a stamper/imprinter with a lubricated imprinting surface, as disclosed in commonly assigned, co-pending U.S. patent application Ser. No. 09/946,939, filed Sep. 5, 2001, the entire disclosure of which is incorporated herein by reference.

In a preliminary step according to the method, a thin film of a thermoplastic polymer, e.g., polymethylmethacrylate (PMMA), is spin-coated on the substrate surface. In another preliminary step, a stamper/imprinter, e.g., formed of Ni, having an imprinting surface with a negative image of servo pattern features having a lateral dimension of about 600 nm and a height of 170 nm is fabricated by conventional optical lithographic patterning/etching techniques and provided with a thin layer of an anti-sticking or release agent. In the next steps according to the disclosed invention, the system of substrate/workpiece and Ni-based stamper/imprinter is heated to above the glass transition temperature ($T_g$) of the PMMA, i.e., above about 105° C., and the negative image of the desired pattern on the imprinting surface of the stamper/imprinter is embossed into the surface of the thermoplastic PMMA layer at a pressure of about 10 MPa. The stamper/imprinter is then maintained in contact with the PMMA layer and under pressure until the system cools down to about 70° C., and then removed from the substrate/workpiece to leave replicated features of the imprinting surface in the surface of the PMMA layer. Subsequent processing of the imprinted substrate/workpiece involves selective removal of substrate material utilizing the imprinted layer of thermoplastic material as a pattern defining (etching) mask, followed by removal of the imprinted layer of thermoplastic material.

Still another process which has been recently studied and developed as a low cost alternative technique for fine dimension pattern/feature formation in a substrate surface is imprinting of a sol-gel layer on a substrate surface, as for example, disclosed in commonly assigned, co-pending U.S. patent application Ser. No. 09/852,084, filed May 10, 2001, the entire disclosure of which is incorporated herein by reference.

According to the process disclosed therein, problems attendant upon the use of very hard surfaced, high modulus materials, e.g., of glass, ceramics, or glass-ceramic composites, as substrates in the manufacture of hard disk recording media are addressed, and the invention is based upon the discovery that the surfaces of such materials may be modified, i.e., reduced in hardness, so as to facilitate formation of servo patterns therein, as by a simple and conveniently performed embossing process. According to the invention, modification (i.e., reduction) of surface hardness of high modulus substrates for use in the manufacture of thin film recording media is obtained by first forming a relatively soft sol-gel coating layer on the substrate surface, embossing the desired servo pattern in the exposed upper surface of the relatively soft sol-gel layer utilizing a stamper/imprinter with an appropriately patterned imprinting surface comprising a patterned plurality of depressions and protrusions having a negative image of the desired servo pattern, and then converting the embossed, relatively soft sol-gel layer to a relatively hard glass-like layer while retaining the embossed servo pattern therein. The thus-formed substrate with embossed servo pattern in the exposed surface thereof is then subjected to thin film deposition thereon for forming the layer stack constituting the magnetic recording medium. The inventive methodology advantageously provides servo-patterned recording media without requiring servo-writing subsequent to media fabrication.

Stampers/imprinters for use in a typical application, e.g., servo pattern formation in the recording layer of a disk-shaped, thin film, longitudinal or perpendicular magnetic recording medium, comprise an imprinting surface having topographical features consisting of larger area data zones separated by smaller areas with well-defined patterns of projections and depressions corresponding to conventionally configured servo sectors, as for example, disclosed in the aforementioned commonly assigned U.S. Pat. No. 5,991,104. For example, a suitable topography for forming the servo sectors may comprise a plurality of projections having a height in the range from about 20 to about 500 nm, a width in the range from about 0.01 to about 1 μm, and a spacing of at least about 0.01 μm.

Stampers/imprinters suitable for use in performing the foregoing patterning processes may be manufactured by a sequence of steps as schematically illustrated in FIG. 6, which steps include providing a "master" comprised of a substantially rigid substrate with a patterned layer of a resist material thereon, the pattern comprising a plurality of projections and depressions corresponding (in positive or negative image form, as necessary) to the desired pattern to be formed in the surface of the stamper/imprinter. Stampers/imprinters are made from the "master" by initially forming a thin, conformal layer of an electrically conductive material (e.g., Ni) over the patterned resist layer and then electroforming a substantially thicker ("blanket") metal layer (e.g., Ni in the case of magnetic stampers/imprinters) on the thin layer of electrically conductive material, which electroformed blanket layer replicates the surface topography of the resist layer. Upon completion of the electroforming process, the stamper/imprinter is separated from the "master".

In practice, the stamper/imprinter separated from the "master" is utilized for forming a "family" of stampers/imprinters. Specifically, the stamper/imprinter formed directly from the "master" is termed a "father" and has a reverse (i.e., negative) replica of the topographical pattern of the "master". The "father" is then utilized for forming several "mothers" (by electroforming as described above) and each "mother" is in turn utilized for forming several "sons" (by electroforming). The "sons" are positive replicas of the "father" and are utilized as the stampers/imprinters for media patterning. Since the "master" is effectively destroyed in the process of making the "father" therefrom, the "family" making process avoids the need for repeatedly manufacturing "master" stampers/imprinters by preserving the "father" and utilizing the "sons". Therefore, process time and cost of making "masters" is substantially reduced by means of the "family" making process.

The thus-formed "son" stampers/imprinters are then subjected to further processing for forming into a desired dimension (i.e., size) and geometrical shape or contour, e.g., an annular disk-shaped stamper/imprinter for use in patterning of annular disk-shaped media such as hard disks, which stampers/imprinters necessarily include a circularly-shaped central aperture defining an inner diameter ("ID") and a circularly-shaped periphery defining an outer diameter ("OD").

Illustratively, annular disk-shaped stampers/imprinters for use in patterning of annular disk-shaped hard disk magnetic recording media typically have an OD of about 138 mm and an ID of about 25 mm. According to conventional manufacturing practices, such annular disk-shaped stampers/imprinters are initially formed (e.g., as described above) in a central portion of a circular disk having a larger OD (e.g., about 8 in.) than the desired OD (e.g., about 138 mm) and then subjected to processing (as by use of a die, the process being termed "punching") to: (1) remove the excess peripherally (i.e., circumferentially) extending portion of the disk extending beyond the desired 138 mm OD; and (2) to form the central aperture defining the desired ~25 mm ID.

The "punched" ID and OD must be accurately aligned with the center of the topographical pattern in order to obtain stampers/imprinters with very accurately aligned IDs and pattern concentricity. Accordingly, highly accurate alignment of the circularly-shaped, larger OD disk-shaped substrates/workpieces manufactured, e.g., as by the Ni electroforming/separation process described above, is essential during the "punching" process for accurately forming at least the central aperture (ID) of the stampers/imprinters formed therefrom. The requisite highly accurate alignment during "punching" of disk-shaped substrates/workpieces is typically obtained by providing the topographically patterned surface with a circularly-shaped alignment mark surrounding the periphery of the topographical pattern. Preferably, the alignment mark is formed concurrently with the topographical pattern to define the center of the pattern, and is utilized for obtaining the highly accurate alignment of the disk by means of a laser-driven alignment system. In the illustrated example pertaining to the manufacture of annular disk-shaped stampers/imprinters for use in patterning of annular disk-shaped recording media, e.g., hard disks, the topographical pattern occupies a circularly-shaped central portion on the surface of the larger OD disk and the alignment mark comprises a larger diameter circularly-shaped ring or band surrounding the topographically patterned portion. Since the alignment mark is utilized only for the "punching" process, it is preferably located as distant from the periphery of the topographical pattern as possible, so that it is not transferred to the media during patterning utilizing the stamper/imprinter.

According to conventional methodology, the surface of the larger OD disk (sometimes referred to herein as "substrate/workpiece") is protected from incurring damage thereto during the "punching" process utilized to define the ID and OD of the stamper/imprinter, typically by formation thereon of a protective film. Since the protective film must not obscure view of the alignment mark or ring by the laser-driven alignment system, the protective film is typically comprised of a transparent film adhered to the disk surface by means of an adhesive layer, e.g., by transparent adhesive tape. However, the use of such adhesive tape-based protective films incurs a drawback/disadvantage in that adhesive residue contaminates the surface of at least the topographically patterned portion of the stamper/imprinter upon removal of the transparent adhesive tape-based protective film subsequent to "punching" for defining the ID and OD. Inasmuch as the adhesive-contaminated are not suitable for use in patterning of recording media, subsequent processing is required for removal of the adhesive contaminant. However, such processing for film removal may result in damage or destruction of the topographical pattern of the stamper/imprinter and introduce additional cost.

In view of the foregoing problems attendant upon the use of conventional transparent adhesive-based protective films in "punching" processing of larger OD disks to form topographically patterned stampers/imprinters of desired dimension and shape or contour, as well as for protecting the stampers/imprinters during handling, transporting, and storage prior to use, there exists a need for methodologies for manufacturing stampers/imprinters which are free of the above-described problems, drawbacks, and disadvantages associated with the use of such transparent adhesive-based protective films. Moreover, there exists a need for methodologies which facilitate rapid, reliable, and cost-effective manufacture of very accurately aligned stampers/imprinters for use in rapid, reliable, accurate, and cost-effective patterning of a variety of types of recording media including, but not limited to, formation of servo patterns in magnetic and magneto-optical (MO) recording media.

The present invention addresses and solves the aforementioned problems, drawbacks, and disadvantages associated with the use of conventional adhesive tape-based protective films during "punching" of larger-sized topographically patterned substrates to define stampers/imprinters of desired dimension and shape, while maintaining full compatibility with the requirements of automated manufacturing technology.

DISCLOSURE OF THE INVENTION

An advantage of the present invention is an improved method of manufacturing a stamper/imprinter for use in patterning of a recording medium.

Another advantage of the present invention is an improved method of manufacturing a stamper/imprinter for use in servo patterning of a recording medium.

Yet another advantage of the present invention is an improved method of manufacturing a stamper/imprinter for use in contact patterning of a magnetic recording medium.

Still another advantage of the present invention is an improved method of manufacturing a stamper/imprinter for use in contact patterning of a servo pattern in the surface of a magnetic recording medium.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by an improved method of manufacturing a stamper/imprinter for use in patterning of a recording medium, comprising sequential steps of:

(a) providing a substrate/workpiece comprising:
(i) a topographical pattern formed in a portion of a surface of the substrate/workpiece, the pattern defining a periphery; and
(ii) an alignment mark formed in another portion of the surface of the substrate/workpiece surrounding the periphery of the topographical pattern;
(b) forming an opaque protective film overlying at least the topographical pattern and the alignment mark;

(c) removing a peripheral portion of the protective film to expose the alignment mark;

(d) removing selected portions of the substrate/workpiece while utilizing the alignment mark for accurate alignment of the substrate/workpiece during the selective removal process; and (e) removing remaining portions of the protective film prior to use in patterning of a recording medium.

According to preferred embodiments of the present invention, step (a) comprises providing a substrate/workpiece wherein the topographical pattern is formed in a central portion of the surface of the substrate/workpiece and defines a circularly-shaped periphery having a first diameter, and wherein the alignment mark formed in the surface of the substrate/workpiece is circularly-shaped with a second, larger diameter.

In accordance with certain preferred embodiments of the present invention, step (a) comprises providing a substrate/workpiece wherein the topographical pattern corresponds to a servo pattern for a magnetic or magneto-optical (MO) recording medium, a read-only memory (ROM) pattern, or a wobble groove pattern for a readable compact disk (CD-R) or a readable-writable compact disk (CD-RW); step (d) comprises removing a circularly-shaped central portion of the substrate/workpiece to form an opening defining an inner diameter (ID) and further comprises removing a circularly-shaped peripheral portion of the substrate/workpiece to define an outer diameter (OD) of an annular disk-shaped stamper/imprinter.

Further preferred embodiments of the present invention include those wherein step (a) comprises providing a substrate/workpiece wherein the topographical pattern corresponds to a servo pattern for a magnetic or magneto-optical (MO) recording medium, and at least the surface thereof is comprised of a magnetic material having a high saturation magnetization $B_{sat} \geq \sim 0.5$ Tesla and a high permeability $\mu \geq \sim 5$.

According to still further preferred embodiments of the present invention, step (b) comprises forming a layer of a release material on the surface of the substrate/workpiece prior to forming the protective film, the layer of release material facilitating subsequent removal of the portions of the protective film in steps (c) and (e). E.g., step (b) comprises forming a passivation layer as the release material layer on the surface of the substrate/workpiece prior to forming a metallic protective film on the surface thereof.

In accordance with certain preferred embodiments of the invention, step (a) comprises providing a substrate/workpiece wherein the surface thereof is comprised of a magnetic material selected from the group consisting of Ni, NiFe, CoNiFe, CoSiFe, CoFe, and CoFeV; step (b) comprises forming an oxide passivation layer on the surface of the substrate/workpiece and forming a hard metallic protective film on the passivation layer; and steps (c) and (e) each comprise mechanically removing respective portions of the protective film. E.g., step (a) comprises providing a substrate/workpiece wherein the surface thereof is comprised of a magnetic material selected from the group consisting of Ni and Ni-containing alloys; and step (b) comprises forming a Ni-containing oxide passivation layer on the surface of the substrate/workpiece and forming a Ni or Ni-containing alloy protective film over the passivation layer.

According to embodiments of the invention, the Ni or Ni-containing alloy protective film has a thickness from about 1 to about 300 μm, e.g., about 50 μm.

Preferred embodiments of the present invention include those wherein step (d) comprises mechanically removing the selected portions of the workpiece/substrate by means of a "punching" process utilizing a die and further comprises aligning the substrate/workpiece utilizing the alignment mark together with a laser-based alignment system.

Another aspect of the present invention is an improved method of manufacturing a stamper/imprinter for use in contact patterning of a magnetic recording medium, comprising sequential steps of:

(a) providing a substrate/workpiece comprising:
 (i) a surface comprised of a magnetic material having a high saturation magnetization $B_{sat} \geq \sim 0.5$ Tesla and a high permeability $\mu \geq \sim 5$;
 (ii) a topographical pattern formed in a central portion of the surface, the topographical pattern defining a periphery and corresponding to a servo pattern for a magnetic recording medium; and
 (iii) an alignment mark formed in another portion of the surface surrounding the periphery of the topographical pattern;

(b) forming a layer of a release material on the surface;

(c) forming an opaque protective film on the layer of release material;

(d) removing a peripheral portion of the protective film to expose the alignment mark;

(e) removing selected portions of the substrate/workpiece while utilizing the alignment mark for accurate alignment of the substrate/workpiece during the removal process; and (f) removing remaining portions of the protective film prior to use in patterning a magnetic recording medium.

According to preferred embodiments of the present invention, step (a) comprises providing a substrate/workpiece wherein the surface thereof is comprised of a magnetic material selected from the group consisting of Ni, NiFe, CoNiFe, CoSiFe, CoFe, and CoFeV; step (b) comprises forming an oxide passivation layer as said layer of release material; and step (c) comprises forming a hard metallic protective film over the passivation layer. E.g., step (c) comprises forming a Ni or Ni-containing alloy protective film having a thickness from about 1 to about 300 μm, such as about 50 nm; and steps (d) and (f) each comprise mechanically removing respective portions of the Ni or Ni-containing protective film.

Further preferred embodiments of the present invention include those wherein step (a) comprises providing a substrate/workpiece wherein the topographical pattern is formed in a central portion of the surface and defines a circularly-shaped periphery having a first diameter, the alignment mark being circularly-shaped with a second, larger diameter; and step (e) comprises removing circularly-shaped central and peripheral portions of the substrate/workpiece to form an annular disk-shaped stamper/imprinter having an inner diameter (ID) and an outer diameter (OD). E.g., step (e) comprises removing the circularly-shaped central and peripheral portions of the substrate/workpiece by means of a "punching" process utilizing a die and aligning the substrate/workpiece utilizing the alignment mark together with a laser-based alignment system.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein:

FIGS. 7 (A)–7 (F) schematically illustrate, in simplified plan view, sequential stages or steps for of a process for performing "punching" processing of a substrate/workpiece to form a stamper/imprinter for recording media patterning, according to an embodiment of the present invention; and FIG. 8 is a block diagram flow chart corresponding to the sequence of steps illustrated in FIG. 7.

DESCRIPTION OF THE INVENTION

The present invention addresses and solves problems, disadvantages, and drawbacks attendant upon shaping of substrates/workpieces to form therefrom stampers/imprinters of desired dimension (i.e., size) and shape or contour, which stampers/imprinters are utilized for performing a variety of rapid, cost-effective patterning processes in the manufacture of various types of recording media, such as, but not limited to forming servo patterns of magnetic or magneto-optical (MO) recording media, patterns for read-only (ROM) memories, and wobble groove patterns for compact disks (CD-R) and readable-writable compact disks (CD-RW). Specifically, the present invention eliminates problems and drawbacks associated with the use of die "punching" techniques for mechanically forming stampers/imprinters of desired dimension and shape or contour from larger substrates/workpieces, wherein the topographically patterned surface portion of the stamper/imprinter is subject to damage or destruction as a consequence of the die "punching" process.

Briefly stated, the present invention is based upon the finding by the inventors that a process comprising the following steps reliably and cost-effectively overcomes the above-described problems associated with the conventional methodology utilized for "punching" of substrates/workpieces for stampers/imprinters:

1. providing a substrate/workpiece including a topographical pattern (r.g., a servo pattern) formed in a central portion thereof and a surrounding alignment mark used during the "punching" process to ensure accurate alignment of the substrate/workpiece;

2. forming an opaque protective film over at least the topographical pattern formed in the central portion of the surface of the substrate/workpiece and the surrounding alignment mark;

3. selectively removing the portion of the protective film overlying the alignment mark to expose the latter and facilitate its use during subsequent "punching" for ensuring accurate alignment of the substrate/workpiece;

4. "punching" the substrate/workpiece to form therefrom a stamper/imprinter of smaller dimension and with a desired shape or contour, e.g., an annular disk comprising the topographical pattern, utilizing the alignment mark for ensuring accurate alignment of the substrate/workpiece; and 5. removing the remaining portions of the protective overlying at least the topographical pattern prior to use of the stamper/imprinter for patterning of a recording medium.

The inventive sequence of process steps will now be described in detail with reference to FIGS. 7(A)–7 (F) and 8 which respectively schematically illustrate in simplified plan view and flow chart form, sequential stages of a process for performing "punching" processing of a substrate/workpiece to form a stamper/imprinter for recording media patterning.

Figure 1:
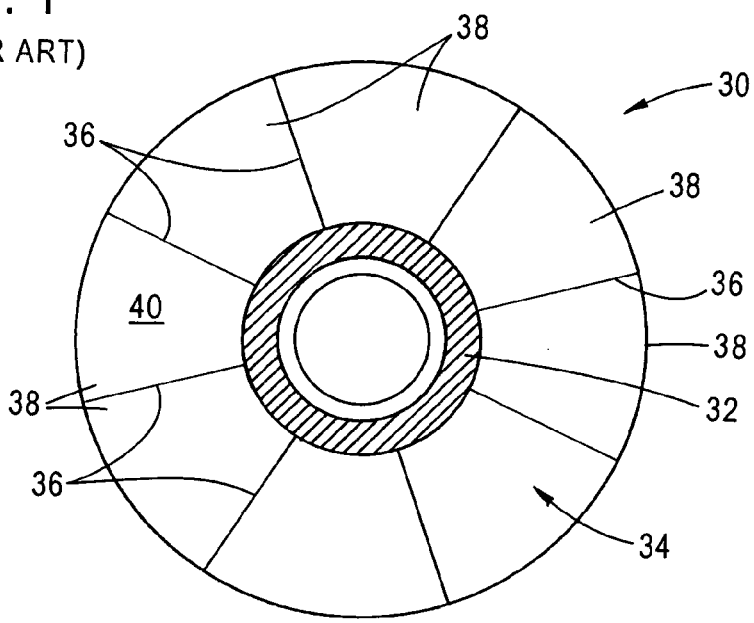
FIG. 1 illustrates, in simplified, schematic plan view, a magnetic recording disk designating the data, servo pattern, and CSS zones thereof.
Figure 2:
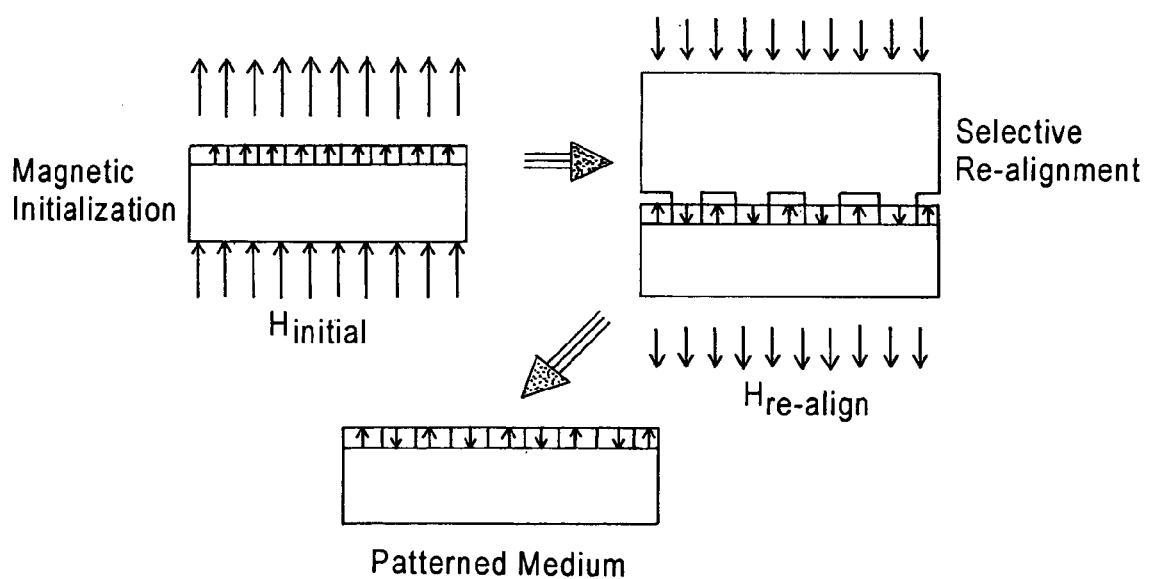
FIG. 2 illustrates, in schematic, simplified cross-sectional view, a sequence of process steps for contact printing a magnetic transition pattern in the surface of a perpendicular magnetic recording layer, utilizing a stamper/imprinter formed of a high saturation magnetization, high permeability magnetic material having an imprinting surface with a surface topography corresponding to the desired magnetic transition pattern.
Figure 3:
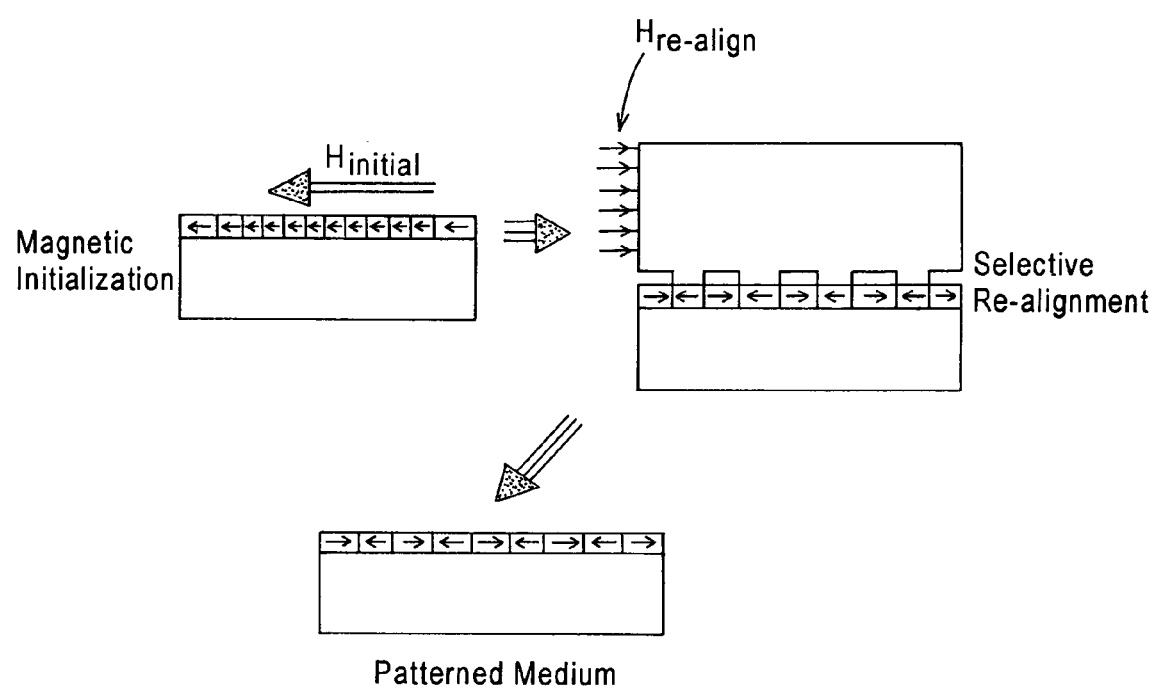
FIG. 3 illustrates, in schematic, simplified cross-sectional view, a similar sequence of process steps for contact printing a magnetic transition pattern in the surface of a longitudinal magnetic recording layer.
Figure 4A:
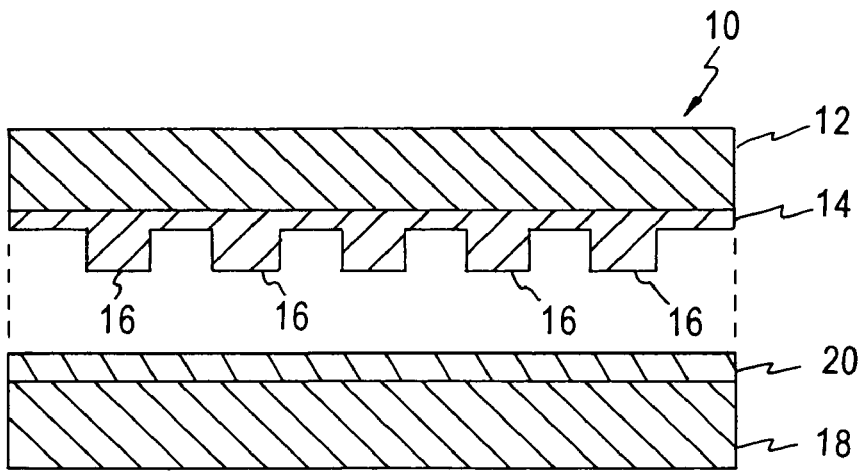
FIGS. 4 (A)–4 (D) illustrate, in simplified cross-sectional view, a process sequence for performing thermal imprint lithography of a thin resist film on a substrate (workpiece), according to the conventional art.
Figure 4B:
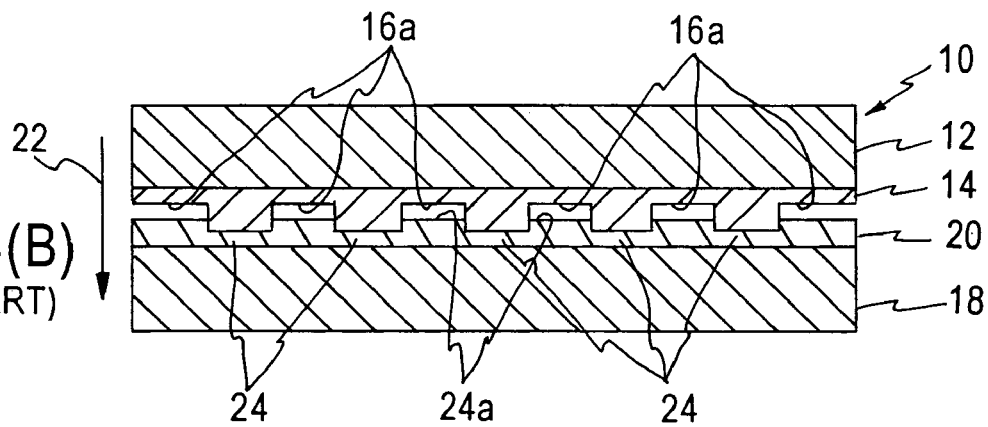
Figure 4C:
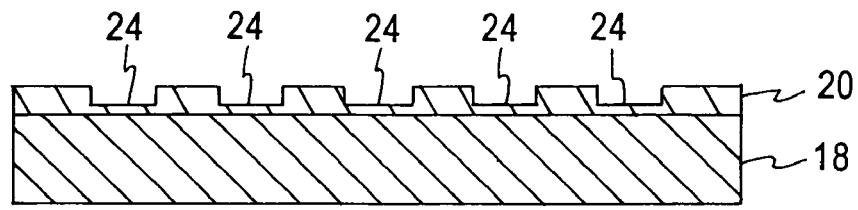
Figure 4D:
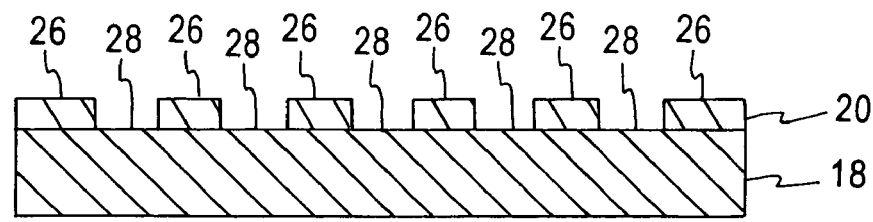
Figure 5:
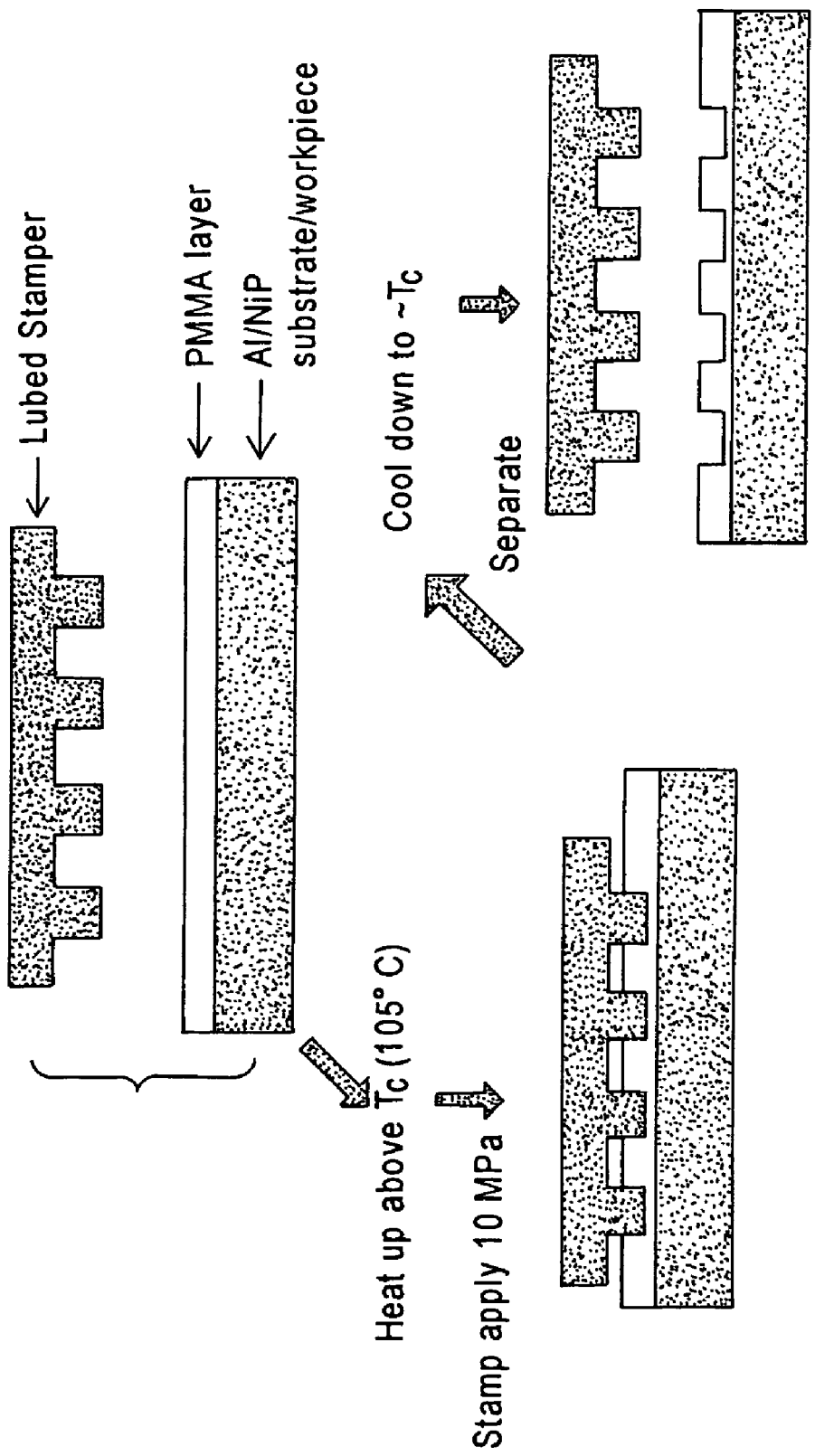
FIG. 5 schematically illustrates, in simplified cross-sectional view, another sequence of steps for performing imprint lithography of a resist film.

Referring to FIG. 7 (A) and block 801 of FIG. 8, in a first step according to the invention, a suitable substrate/workpiece for use in fabricating a stamper/imprinter therefrom is provided, which substrate/workpiece is of larger areal dimension than the stamper/imprinter to be formed therefrom and comprises a topographical pattern formed in a central portion of the surface thereof, the pattern defining a periphery surrounded by an unpatterned, peripheral surface portion. The substrate/workpiece may be formed of any suitable mechanically hard and robust material or materials, selected for the particular patterning process to be performed using the resultant stamper/imprinter. Therefore, at least the imprinting surface of stampers/imprinters intended for use in preferred embodiments of the invention, for example, magnetic patterning of magnetic recording media by contact printing, e.g., as described supra and illustrated in FIGS. 1–3, must be comprised of a magnetic material having a high saturation magnetization $B_{sat} \geq \sim 0.5$ Tesla and a high permeability $\mu \geq \sim 5$, e.g., a magnetic material selected from the group consisting of Ni, NiFe, CoNiFe, CoSiFe, CoFe, and CoFeV; whereas stampers/imprinters intended for use in performing media patterning by thermal imprinting, e.g., as described supra and illustrated in FIGS. 4–5, may comprise a variety of hard-surfaced materials, including metals, alloys, dielectrics, semiconductors, ceramics, and composite materials.

According to preferred embodiments of the present invention, e.g., as in the embodiment illustrated in FIG. 7, the substrate/workpiece is circularly-shaped and the topographically patterned portion of the surface for forming the stamper/imprinter is annularly-shaped, concentric with, and of smaller diameter than the substrate/workpiece, whereby the topographically patterned portion defines a periphery surrounded by an unpatterned portion.

The size and shape of stampers/imprinters formed according to the inventive methodology are determined by the intended patterning process, By way of illustration, but not limitation, annular disk-shaped stampers/imprinters are utilized in patterning, e.g., servo patterning, of annular disk-shaped hard disk magnetic recording media, which media and stampers/imprinters typically have an OD of about 138 mm and an ID of about 25 mm, and wherein the topographical pattern includes a plurality of sub-micron-dimensioned features, including protrusions and depressions in the form of pillars, holes, trenches, etc., corresponding to the desired servo pattern to be formed in the surface of the media. According to conventional manufacturing practices, such annular disk-shaped stampers/imprinters are initially formed in a central portion of a larger diameter circular disk (e.g., OD about 8 in.) than the desired OD (e.g., about 138 mm) of the stamper/imprinter and then subjected to processing (as described below) to: (1) remove the excess peripherally (i.e., circumferentially) extending portion of the disk extending beyond the desired 138 mm OD; and (2) to form the central aperture defining the desired ~25 mm ID.

Figure 6:
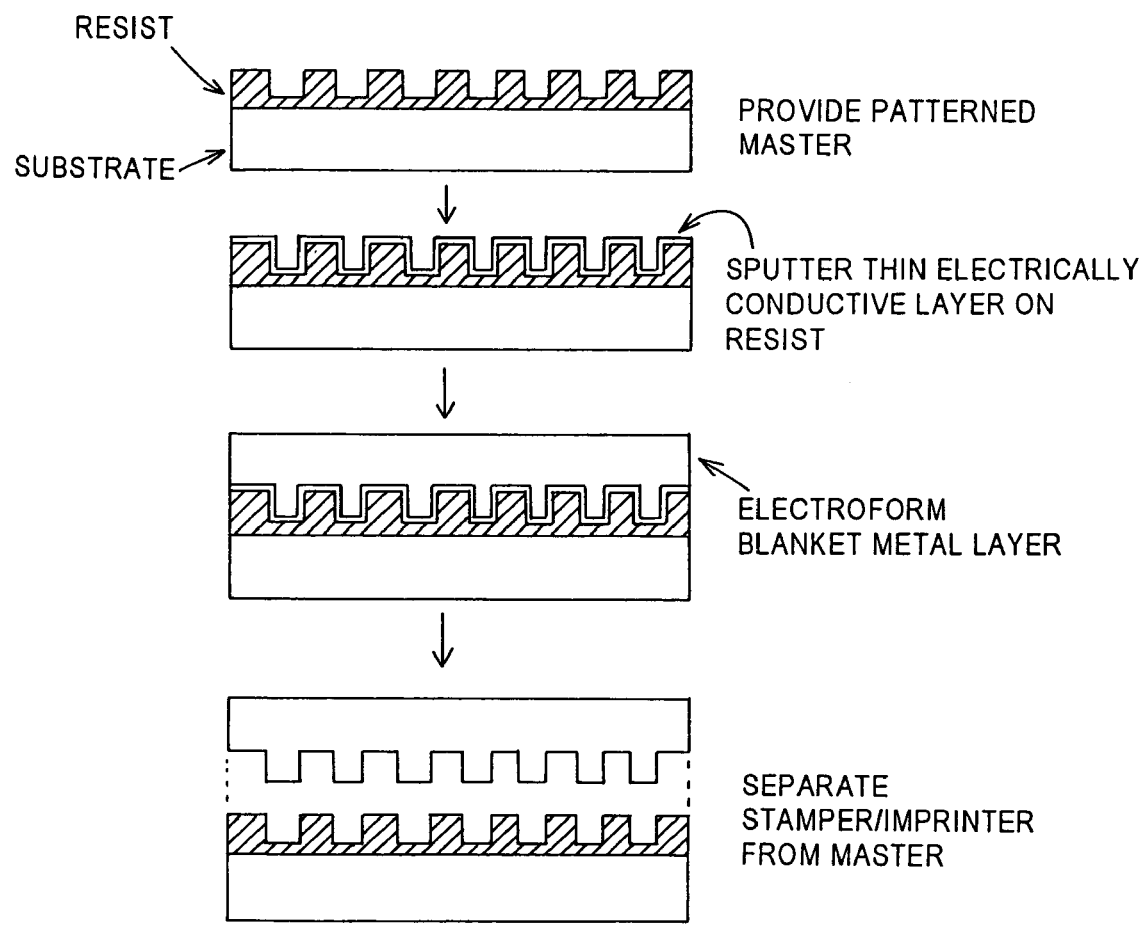
FIG. 6 schematically illustrates, in simplified cross-sectional view, a sequence of steps for forming a stamper/imprinter for recording media patterning, according to the conventional art.

In the illustrated embodiment, an alignment mark, in the form of a ring or band, is shown as formed in a next step (refer to FIG. 7 (B) and block 802 of FIG. 8); however, the alignment mark is preferably formed concurrent with formation of the topographical pattern (as, for example, by a process such as illustrated in FIG. 6). The alignment mark, when utilized together with a laser-based alignment system, provides accurate alignment of the substrate/workpiece during subsequent processing (e.g., die "punching") for forming a stamper/imprinter of desired dimension (size) and shape or contour. As indicated supra, the alignment mark is preferably placed as distant from the periphery of the topographical pattern as is possible, in order to avoid transfer of the alignment mark to the recording medium during patterning.

Also formed in the step illustrated in FIG. 7 (B) and summarized in block 802 of FIG. 8, is a layer of a material for facilitating release (i.e., removal as by mechanical lift-off) of a protective film or layer subsequently formed over at least the topographically patterned portion of the surface of the substrate/workpiece and the surrounding alignment mark. While selection of the material for use as the release layer (and its thickness) depends upon the particular materials of the imprinting surface of the stamper/imprinter and the protective layers, oxide layers, such as oxide-based passivation layers derived from metal-based imprinting surfaces, e.g., thermal or anodic oxides of Ni-containing magnetic imprinting surfaces, are useful and preferred for this purpose when the imprinting surface comprises Ni or a Ni-containing alloy and the protection layer is similarly comprised of Ni or a Ni-containing alloy. The release layer is preferably formed subsequent to formation of the alignment mark.

Referring now to FIG. 7 (C) and block 803 of FIG. 8, an opaque protective film or layer, e.g., a mechanically hard metallic film or layer having a thickness of, e.g., from about 1 to about 300 μm, illustratively about 50 μm thick, is then formed over at least the topographically patterned portion of the surface of the substrate/workpiece and the surrounding alignment mark, as by any convenient process, e.g., plating, vapor deposition, sputtering, CVD, PECVD, etc. By way of illustration, but not limitation, the protective layer or film may preferably comprise Ni, an alloy thereof, or other magnetic metal or alloy, when the imprinting surface of the stamper/imprinter is comprised of Ni, an alloy thereof, or other magnetic metal or alloy.

Adverting to FIG. 7 (D) and block 804 of FIG. 8, inasmuch as the protective layer or film formed in the previous step is sufficiently thick as to provide sufficient mechanical robustness and protection during the "punching" process, the alignment mark is typically rendered opaque to the laser beam utilized therewith for accurately aligning the substrate/workpiece during the die "punching" processing for defining the ID and OD of the stamper/imprinter. According to the invention, therefore, the portion of the protective layer or film surrounding the periphery of the topographical pattern is then selectively removed to expose the alignment ring or band. Removal, or "lift-off", of the peripheral portion of the protective layer or film is facilitated by the presence of the underlying release layer and may be accomplished mechanically, e.g., as by use of an adhesive lift-off tape or with finger assist.

With reference to FIG. 7 (E) and block 805 of FIG. 8, in the next step according to the invention, the substrate/workpiece with the protective layer removed from the periphery thereof to expose the alignment ring or band, is subjected to processing for defining the size (e.g., OD) and shape of the stamper/imprinter (e.g., annular, with an OD and an ID), as by mechanical processing, preferably die "punching". According to the inventive methodology: (1) the topographically patterned surface of the substrate/workpiece is protected from damage during the "punching" process by means of the mechanically hard and robust protective layer; and (2) accurate alignment during the "punching" process is provided by the exposed alignment ring or band utilized in conjunction with a laser beam-based alignment system.

In the ultimate step according to the invention, shown in FIG. 7 (F) and summarized in block 806 of FIG. 8, the protective film is removed from at least the topographically patterned imprinting surface portion of the stamper/imprinter, immediately prior to use of the latter for media patterning, it being noted that the protective film is preferably retained during handling, transporting, and storage of the stamper/imprinter prior to its use. As before, removal, or "lift-off", of the remaining portion(s) of the protective layer or film is facilitated by the presence of the underlying release layer and may be accomplished mechanically, e.g., as by use of an adhesive lift-off tape or with finger assist.

The present invention thus affords a number of significant advantages over previous processes for forming stampers/imprinters utilized for patterning various types of recording media, including, but not limited to, formation of servo patterns in magnetic recording layers, including the ability to form stampers/imprinters from larger-sized substrates/workpieces without damaging or otherwise compromising the quality of the topographical pattern.

It should be apparent to one of ordinary skill in the art that the present invention provides a significant improvement over the conventional art such as has been described above, particularly with respect to the ease and simplicity of manufacturing high replication fidelity stampers/imprinters for use in various types of media patterning processes. Further, the imprinting surface of the stampers/imprinters according to the invention can be formed with a wide variety of topographical patterns, whereby the inventive methodology can be rapidly, easily, and cost-effectively implemented in the automated manufacture of a number of articles, devices, etc., requiring patterning, of which servo patterning of longitudinal and perpendicular magnetic recording media merely constitute examples of the versatility and utility of the invention.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of manufacturing a stamper/imprinter for use in patterning of a recording medium, comprising sequential steps of:
   (a) providing a substrate/workpiece comprising:
      (i) a topographical pattern formed in a portion of a surface of said substrate/workpiece, said pattern defining a periphery; and
      (ii) an alignment mark formed in another portion of said surface of said substrate/workpiece surrounding said periphery of said topographical pattern;
   (b) forming an opaque protective film overlying at least said topographical pattern and said alignment mark;
   (c) removing a peripheral portion of said protective film to expose said alignment mark formed in said surface of said substrate/workpiece;
   (d) removing selected portions of said substrate/workpiece while utilizing said alignment mark for accurate alignment of said substrate/workpiece during the selective removal process; and
   (e) removing remaining portions of said protective film prior to use in patterning of a recording medium.

2. The method as in claim 1, wherein:
   step (a) comprises providing a substrate/workpiece wherein said topographical pattern is formed in a central portion of said surface of said substrate/workpiece and defines a circularly-shaped periphery having a first diameter, and wherein said alignment mark formed in said surface of said substrate/workpiece is circularly-shaped with a second, larger diameter.

3. The method as in claim 2, wherein:
   step (a) comprises providing a substrate/workpiece wherein said topographical pattern corresponds to a servo pattern for a magnetic or magneto-optical (MO) recording medium, a read-only memory (ROM) pattern, or a wobble groove pattern for a readable compact disk (CD-R) or a readable-writable compact disk (CD-RW).

4. The method as in claim 3, wherein:
   step (d) comprises removing a circularly-shaped central portion of said substrate/workpiece to form an opening defining an inner diameter (ID).

5. The method as in claim 4, wherein:
   step (d) further comprises removing a circularly-shaped peripheral portion of said substrate/workpiece to define an outer diameter (OD) of an annular disk-shaped stamper/imprinter.

6. The method as in claim 3, wherein:
   step (a) comprises providing a substrate/workpiece wherein said topographical pattern corresponds to a servo pattern for a magnetic or magneto-optical (MO) recording medium.

7. The method as in claim 6, wherein:
   step (a) comprises providing a substrate/workpiece wherein at least said surface is comprised of a magnetic material having a high saturation magnetization $B_{sat} \geq \sim 0.5$ Tesla and a high permeability $\mu \geq \sim 5$.

8. The method as in claim 1, wherein:
   step (b) comprises forming a layer of a release material on said surface of said substrate/workpiece prior to forming said protective film, said layer of release material facilitating subsequent removal of said portions of said protective film in steps (c) and (e).

9. The method as in claim 8, wherein:
   step (b) comprises forming a passivation layer as said release material layer on said surface of said substrate/workpiece prior to forming a metallic protective film on said surface of said substrate/workpiece.

10. The method as in claim 9, wherein:
    step (a) comprises providing a substrate/workpiece wherein said surface is comprised of a magnetic material selected from the group consisting of Ni, NiFe, CoNiFe, CoSiFe, CoFe, and CoFeV;
    step (b) comprises forming an oxide passivation layer on said surface of said substrate/workpiece and forming a hard metallic protective film over said passivation layer; and
    steps (c) and (e) each comprise mechanically removing respective portions of said protective film.

11. The method as in claim 9, wherein:
    step (a) comprises providing a substrate/workpiece wherein said surface is comprised of a magnetic material selected from the group consisting of Ni and Ni-containing alloys; and
    step (b) comprises forming a Ni-containing oxide passivation layer on said surface of said substrate/workpiece and forming a Ni or Ni-containing alloy protective film over said passivation layer.

12. The method as in claim 11, wherein:
    step (b) comprises forming a Ni or Ni-containing alloy protective film having a thickness from about 1 to about 300 μm.

13. The method as in claim 12, wherein:
    step (b) comprises forming a Ni or Ni-containing alloy protective film having a thickness of about 50 μm.

14. The method as in claim 1, wherein:
    step (d) comprises mechanically removing said selected portions of said workpiece/substrate.

15. The method as in claim 14, wherein:
    step (d) comprises removing said selected portions of said substrate/workpiece by means of a "punching" process utilizing a die.

16. The method as in claim 14, wherein:
    step (d) further comprises aligning said substrate/workpiece utilizing said alignment mark together with a laser-based alignment system.

17. A method of manufacturing a stamper/imprinter for use in contact patterning of a magnetic recording medium, comprising sequential steps of:
    (a) providing a substrate/workpiece comprising:
       (i) a surface comprised of a magnetic material having a high saturation magnetization $B_{sat} \geq \sim 0.5$ Tesla and a high permeability $\mu \geq \sim 5$;

(ii) a topographical pattern formed in a central portion of said surface, said topographical pattern defining a periphery and corresponding to a servo pattern for a magnetic recording medium; and (iii) an alignment mark formed in another portion of said surface surrounding said periphery of said topographical pattern;

(b) forming a layer of a release material on said surface;

(c) forming an opaque protective film on said layer of release material;

(d) removing a peripheral portion of said protective film to expose said alignment mark;

(e) removing selected portions of said substrate/workpiece while utilizing said alignment mark for accurate alignment of said substrate/workpiece during the removal process; and (f) removing remaining portions of said protective film prior to use in patterning of a magnetic recording medium.

18. The method as in claim 17, wherein:

step (a) comprises providing a substrate/workpiece wherein said surface is comprised of a magnetic material selected from the group consisting of Ni, NiFe, CoNiFe, CoSiFe, CoFe, and CoFeV;

step (b) comprises forming an oxide passivation layer as said layer of release material; and step (c) comprises forming a hard metallic protective film over said passivation layer.

19. The method as in claim 18, wherein:

step (c) comprises forming a Ni or Ni-containing alloy protective film having a thickness from about 1 to about 300 µm; and steps (d) and (f) each comprise mechanically removing respective portions of said Ni or Ni-containing protective film.

20. The method as in claim 17, wherein:

step (a) comprises providing a substrate/workpiece wherein said topographical pattern is formed in a central portion of said surface and defines a circularly-shaped periphery having a first diameter, said alignment mark being circularly-shaped with a second, larger diameter; and step (e) comprises removing circularly-shaped central and peripheral portions of said substrate/workpiece to form an annular disk-shaped stamper/imprinter having an inner diameter (ID) and an outer diameter (OD).

21. The method as in claim 20, wherein:

step (e) comprises removing said circularly-shaped central and peripheral portions of said substrate/workpiece by means of a "punching" process utilizing a die and aligning said substrate/workpiece utilizing said alignment mark together with a laser-based alignment system.

* * * * *